(12) United States Patent
Baski et al.

(10) Patent No.: US 6,413,880 B1
(45) Date of Patent: Jul. 2, 2002

(54) STRONGLY TEXTURED ATOMIC RIDGE AND DOT FABRICATION

(75) Inventors: Alison Baski, Midlothian, VA (US); Don Kendall, Albuquerque, NM (US)

(73) Assignees: StarMega Corporation, Alburquerque, NM (US); Virginia Commonwealth University, Richmond, VA (US)

(*) Notice: Subject to any disclaimer, the term of this patent is extended or adjusted under 35 U.S.C. 154(b) by 0 days.

(21) Appl. No.: 09/657,533

(22) Filed: Sep. 8, 2000

Related U.S. Application Data
(60) Provisional application No. 60/153,088, filed on Sep. 10, 1999.

(51) Int. Cl.[7] .................. H01L 21/31; H01L 21/469
(52) U.S. Cl. ............... 438/759; 438/650; 438/666; 438/2; 438/800; 257/9; 257/23
(58) Field of Search .................. 438/798, 962, 438/666, 700, 2, 759, 964, 973, 650, 686, 945, 947, 800; 257/9, 23, 30, 49, 594, 622, 773, 618, 68; 205/153, 173; 29/25.02

(56) References Cited

U.S. PATENT DOCUMENTS

| | | | |
|---|---|---|---|
| 4,983,540 A | 1/1991 | Yamaguchi et al. | 437/110 |
| 4,987,094 A | 1/1991 | Colas et al. | 437/81 |
| 5,258,326 A | 11/1993 | Morishima et al. | 437/107 |
| 5,296,719 A | 3/1994 | Hirai et al. | 257/14 |
| 5,300,452 A | 4/1994 | Chang et al. | 437/126 |
| 5,327,675 A | 7/1994 | Butler et al. | 43/113 |
| 5,372,675 A | 12/1994 | Wakabayashi et al. | 156/649 |
| 5,482,890 A | 1/1996 | Lin et al. | 437/107 |
| 5,567,954 A | 10/1996 | Dobson et al. | 257/3 |
| 5,581,091 A * | 12/1996 | Moskovits et al. | 257/9 |
| 5,612,255 A | 3/1997 | Chapple-Sokol et al. | 437/203 |
| 6,177,291 B1 * | 1/2001 | Eriguchi et al. | 438/42 |
| 6,204,596 B1 * | 3/2001 | Macaulay et al. | 313/310 |
| 6,231,744 B1 * | 5/2001 | Ying et al. | 205/324 |
| 6,245,640 B1 * | 6/2001 | Claussen et al. | 438/424 |
| 6,248,674 B1 * | 6/2001 | Kamins et al. | 438/798 |
| 6,274,498 B1 * | 8/2001 | Moore et al. | 438/692 |
| 6,314,019 B1 * | 11/2001 | Kuekes et al. | 365/151 |

OTHER PUBLICATIONS

Jorritsma, J. et al. ; "Magnetic Properties of Au(1–x)Fe(x) Nanowires"; pp. 994–996; IEEE Transactions on Magnetics; Jul. 1998; San Francisco, CA, USA.*
Kendall, Don L., "Far Beyond Microelectronics with Silicon (Top Ten Speculations from Bulk Micromachining)."
Jones et al., "Noble Metal Row Growth on SI (5 5 12)," submitted to *World Scientific*.
Baski et al., "STM Studies of 1–D Noble Metal Growth on Silicon," submitted to *Ultramicroscopy (Heidelberg 2000)*.

* cited by examiner

*Primary Examiner*—Wael Fabury
*Assistant Examiner*—Fernando Toledo
(74) *Attorney, Agent, or Firm*—Jagtiani + Guttag

(57) ABSTRACT

The present invention provides a method for producing atomic ridges on a substrate comprising: depositing a first metal on a substrate; heating the substrate to form initial nanowires of the first metal on the substrate; depositing a second metal on the initial nanowires of the first metal to form thickened nanowires that are more resistant to etching than the initial nanowires; and etching the substrate to form atomic ridges separated by grooves having a pitch of 0.94 to 5.35 nm. The present invention also provides a method for forming Au and other metal nanowires that may be used for electrical conductors and both positive and negative etch masks to form a plurality of ridges at a pitch of 0.94 to 5.35 nm containing at least two adjacent grooves with widths of 0.63 to 5.04 nm.

37 Claims, 5 Drawing Sheets

STRONGLY TEXTURED ATOMIC RIDGE AND DOT FABRICATION

CROSS-REFERENCE TO RELATED APPLICATIONS

This application makes reference to the following co-pending U.S. Patent Applications: U.S. Provisional Patent Application No. 60/153,088, filed Sep. 10, 1999 and U.S. patent application Ser. No. 09/187,730, entitled "QUANTUM RIDGES AND TIPS" filed Nov. 9, 1998, the entire disclosure and contents of which are hereby incorporated by reference.

BACKGROUND OF THE INVENTION

1. Field of the Invention

The present invention relates generally to methods for formation of atomic ridges.

2. Description of the Prior Art

Metal-semiconductor growth systems that exhibit one-dimensional (1-D) structures on the nanometer scale have lately been of interest, particularly those that form nanowires. Usually such structures have been grown by depositing metals on periodically stepped (or vicinal) surfaces. However, this step growth method has the disadvantage that the steps are not atomically straight, and that the deposited metal must preferentially nucleate at the step edges.

1-D structures also be grown using other types of surface morphologies other than steps. A number of high-index, "tilted" silicon surfaces possess unique morphologies not found on their low-index counterparts. For example, the recently discovered surface of Si(5 5 12) is oriented 30.5 away from (001) towards (111) and forms a single-domain, planar reconstruction composed of row-like structures. It is known that group-III metals cause major faceting of this surface, see Baski et al., Surf. Sci. 423, L265–270 (1999). In contrast, the deposition and annealing of noble metals on Si(5 5 12) may lead to the formation of nanowire arrays.

SUMMARY OF THE INVENTION

It is therefore an object of the present invention to provide a method for forming regularly spaced atomic ridges on a silicon wafer with a variety of spacings (or pitch).

It is another object of the present invention to provide a method for forming regularly spaced Au and other metal nanowires, as well as either positive or negative lithographic etch masks, for forming a variety of useful structures on particular crystal surfaces of Si and other semiconductors.

According to a first broad aspect of the present invention, there is provided a method for producing atomic ridges on a substrate comprising: depositing a first metal on a substrate; heating the substrate to form initial nanowires of the first metal on the substrate; depositing a second metal on the initial nanowires of the first metal to form thickened nanowires that are more resistant to etching than the initial nanowires; and etching the substrate to form atomic ridges separated by grooves having a pitch of 0.94 to 5.35 nm.

According to a second broad aspect of the invention, there is provided a method for producing Au nanowires on a substrate comprising: depositing Au on a substrate; heating said substrate to form a plurality of Au nanowires on the substrate wherein at least two adjacent nanowires of the plurality of Au nanowires are at a pitch of 2.51 to 3.45 nm.

Other objects and features of the present invention will be apparent from the following detailed description of the preferred embodiment.

BRIEF DESCRIPTION OF THE DRAWINGS

The invention will be described in conjunction with the accompanying figures, in which.

DETAILED DESCRIPTION OF THE PREFERRED EMBODIMENT

Figure 1:
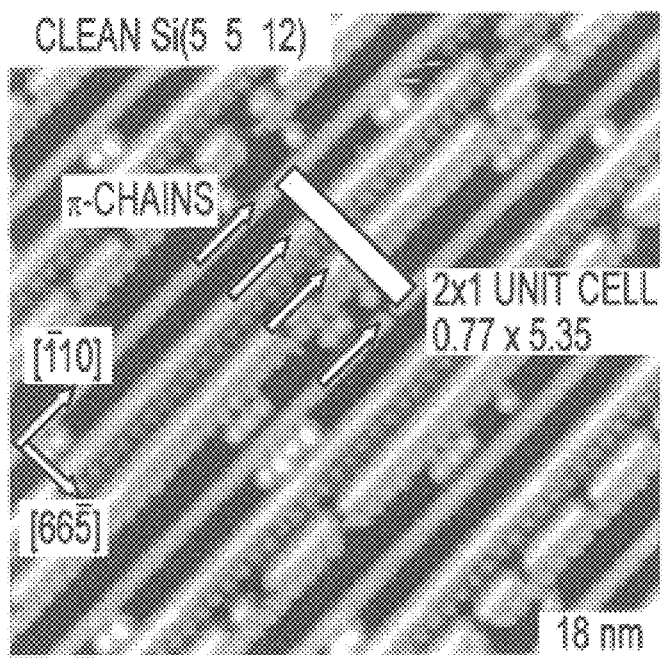
FIG. 1 is a scanning tunneling microscopy (STM) image of the clean Si(5 5 12)–2×1 reconstructed surface, in which a 2×1 unit cell is outlined and consists of one (7 7 17) subunit cell (wider) and one (337) subunit (narrower) and the main surface features include three pi-bonded chains per 2×1 unit cell.

It is advantageous to define several terms before describing the invention. The following definitions are used throughout this application.

Definitions

Where the definition of terms departs from the commonly used meaning of the term, applicant intends to utilize the definitions provided below, unless specifically indicated.

For the purposes of the present invention, the term "monolayer (ML)" refers to one atomic layer of metal on a surface of a given orientation.

For the purposes of the present invention, the term "Ultra High Vacuum (UHV)" refers to a pressure of less than $1 \times 10^{-9}$ Torr.

For the purposes of the present invention, the term "Reactive Ion Beam Etching (RIBE)" refers to one of the plasma or dry-etching methods that may be used to produce the grooves of this invention.

For the purposes of the present invention, the term "surfactant restructurant" refers to a single element or several elements that help restructure the surface of a substrate used in the formation of grooves, ridges, tips, oxide ridges, quantum wires, or other structures of the present invention.

For the purposes of the present invention, the term "nanowire" refers to an overlayer row resulting from the deposition of a metal on the silicon surface. Such a nanowire has a width of ~1 to 4 nm, a length of 10 nm or longer, and a pitch of ~1 to 5 nm.

For the purposes of the present invention the term "pitch" refers to the separation between two adjacent nanowires, atomic ridges or grooves.

For the purposes of the present invention, the term "atomic ridge" refers to a ridge formed in the silicon wafer primarily from an etching procedure following the growth of nanowires.

For the purposes of the present invention, the term "Molecular Beam Epitaxy (MBE)" refers to the deposition of elements onto a substrate using evaporators in a UHV environment.

Description

The recently discovered surface of Si(5 5 12) forms a single domain, planar reconstruction that is entirely composed of row-like structures, see A. A. Baski, S. C. Erwin, and L. J. Whitman, *Science* 269, 1556 (1995) and A. A. Baski, S. C. Erwin, and L. J. Whitman (1997). *Surf Sci.* 392, 69 (1997). These rows consist of structural units already known to exist on the low-index surfaces. such as pi-chains and tetramers, see R. M. Feenstra and J. A. Stroscio, *Phys. Rev. Lett.* 59, 21 73 (1987). Unfortunately, group-III metals strongly interact with the Si(5 5 12) surface and induce large-scale faceting, see A. A. Baski and L. J. Whitman. *J Vac. Sci. Technol. B* 14, 992 (1996). However, recent scanning tunneling microscopy (STM) studies have shown that a noble metal such as Ag grows in an ordered manner on this surface, see H. H. Song, K. M. Jones, and A. A. Baski, *J. Vac. Sci. Technol. A* 17, 1696 (1999).

The process of the present invention preferably starts with a high temperature, on the order of 100–1200° C. treatment of a special orientation wafer such as Si(5 5 12), Si(7 7 15), or Si(5 5 11) in an Ultra High Vacuum (UHV) system. The wafer is then cooled at a slow rate to near room temperature (RT), at which point a fraction of an atomic monolayer (ML) of an element such as Au, Ag, etc. is evaporated onto the wafer. The wafer is then heated to a specific temperature range, which depends on the element deposited. the thickness of the deposited element, and the substrate on which the element is deposited. As a result of the heat treatment, nanowires are formed of the deposited element.

After the metal nanowires are formed on a Si wafer, additional treatments to the Si wafer are used to produce grooves in the unprotected Si between the metal nanowires, thereby producing atomic ridges. Depending on the application. the metal nanowires may be removed from the atomic ridges.

In one preferred embodiment, the additional treatment of the Si wafer includes thickening or protecting the thin metal nanowires to make the metal nanowires more etch-resistant during various conventional wet chemical or dry etching treatments. Once the metal nanowires have been thickened, the Si wafer is etched to produce grooves having a pitch of 0.94 to 5.35 nm.

A method of depositing Ag on a Si(5 5 12) surface suitable for use in the method of the present invention is described in Baski et al., J. Vac. and Tech. 17, 1696 (1999). the entire disclosure and contents of which is hereby incorporated by reference. The process of Baski et al. starts with a clean single crystal wafer of Si(5 5 12). The wafer is then heated to 1150–1200° C. in a UHV system to vaporize any native oxide and to allow the surface to restructure into the well-ordered structure characterized by a surface unit cell of 5.35 nm, see FIG. 1. The wafer is then slowly cooled to room temperature, and very thin layer of only about 0.25 monolayers (ML) of Ag is evaporated from a tungsten filament onto the surface and the surface is annealed at a moderate temperature (450 to 550° C.), see FIG. 3. The Ag atoms move around on the surface and form Ag nanowires of about 1.6 nm width on a pitch of 5.35 nm, namely with the spacing of the surface cell mentioned above. This process is similar to that for Au deposition on such a surface as described in U.S. patent application Ser. No. 09/187,730 filed Nov. 9, 1998 and International Patent Application No. PCT/US98/23875 filed Nov. 9, 1998, the entire contents and disclosure of which are hereby incorporated by reference.

Figure 2:
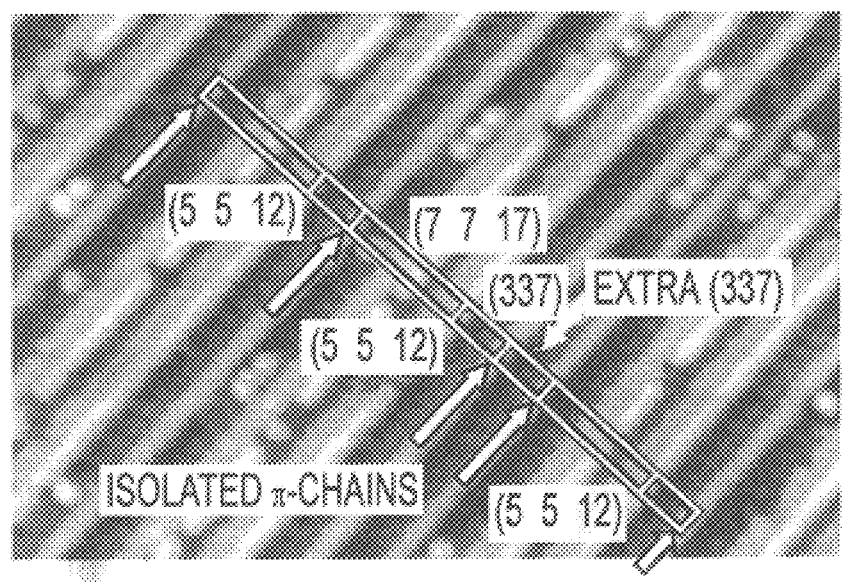
FIG. 2 is an image of a Si(5 5 12) surface showing a disruption in the surface periodicity in which there is an extra (337) unit cell.
Figure 7:
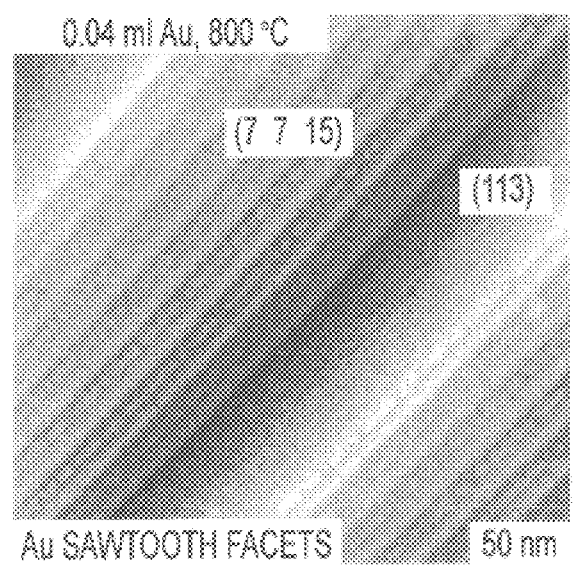
FIG. 7 illustrates Au growth on Si(5 5 12) to form a (7 7 15) template for a nanowire array.

Instead of Ag, Au may also be used to form other nanowire arrays with different pitches. The deposition of 0.04 to 0.12 ML Au on Si(5 5 12) and annealing to ~800° C. results in the formation of large (7 7 15) facet planes with interposed (113) steps, see FIG. 7. The (7 7 15) atomic ridges have a very regular spacing of 3.45 nm over large areas, unlike the situation with (5 5 12) atomic ridges which may have as many as 20% surface faults, one of which is shown in FIG. 2. Therefore, Au deposited onto specially cut and precisely aligned (7 7 15) wafers will result in a very regular array of nanowires with a pitch of 3.45 nm. These regularly spaced nanogrooves may be used to create atomic ridges (or grooves) via possible subsequent oblique metal evaporation, and wet or dry etching of the Si substrate. as discussed in U.S. patent application Ser. No. 09/187,730, filed Nov. 9, 1998, the entire disclosure and contents of which is hereby incorporated by reference.

In the method of the present invention, when Ag nanowires are deposited, preferably the Ag is deposited to a thickness of 0.15 to 2.5 ML on a Si substrate. In the method of the present invention, when Au nanowires are deposited, preferably the Au is deposited to a thickness of 0.04 to 1.0 ML on a Si substrate.

In these processes, a fraction of a monolayer of a surfactant element, such as Ga, Au, Ag, or other elements may also be added to the Si surface prior to metal deposition. The use of surfactants may enhance the surface diffusion of the deposited metal or the substrate atoms and modify the favored crystal planes and necessary temperature ranges.

On the Si(5 5 12) surface, there may be occasional surface faults that disrupt the regularity of the atomic ridges for ~20% of the ridges. see FIG. 2. Occasionally, there are extra (3 3 7) segments of 1.6 nm width on the (5 5 12) surface, so the sequence may become: 5.4 nm, 5.4 nm, 5.4 nm, 7.0 nm, 5.4 nm, 5.4 nm, etc. Alternatively, occasionally there are missing (337) segments to produce a sequence: 5.4 nm, 5.4, 5.4 nm, 3.8 nm, 5.4 nm. 5.4 nm, etc. The sample mounting procedure may control this regularity, where purposeful mounting at tensile or compressive stress could control the density and type of defect. One method of controlling and even eliminating such stress involves using quartz wedges during the high temperature flashing process and/or at lower temperatures. At a particular low value of induced stress it should be possible to produce a wafer with a greatly reduced number of such surface faults.

In addition to occasional irregularities of the (5 5 12) pattern, there are sometimes small surface modulations of the crystal orientations on the Si wafer due to manufacturing issues. One method to minimize such modulations is to add concave or convex regions on the (5 5 12) or other (I IX) wafers, as described in U.S. patent application Ser. No. 09/187,730. the entire disclosure and contents of which is hereby incorporated by reference.

One process to produce the locally concave dimples, and ultimately atomically flat regions, is to heat a spot on the wafer to a temperature of 800 to 975° C. with a laser, other localized light or x-ray source, electron, or ion or neutral particle beam when the sample is in a UHV or in a clean low pressure active-gas chamber. The temperature is generally limited to ~975 ° C. or lower in order to stay below the elastic limit of Si and to reduce the diffusion of the substrate atoms in neighboring regions. However, brief pulse-heating at higher temperatures may also sometimes be used. If done in molecular oxygen at a pressure in the range of $10^{-8}$ Torr or in various active gas environments such as Cl, Ar, $Si_2H_6$, or H, this process will result in local etching and the formation of large concave regions with atomically flat regions near their centers. For the important molecular $O_2$ case with uniform wafer heating, see J. B. Hannon, et al., Phys. Rev. Lett. 81, 4676 (1998).

A modification of the above procedure involves splitting the laser or other energy beams into multiple beams to form a regular submicrometer or larger spaced array. This splitting allows multiple atomically flat regions to be produced in precisely located regions on the wafer for subsequent device and integrated circuit processing. The various means for splitting the beam may include interferometric methods and physical obstructions (i.e. Si or other "screenwire shadow masks" interposed near the wafer in front of an intense large area beam).

The laser or other energy beams above may also be split into multiple beams in regularly spaced submicron or larger arrays by various means so that multiple atomically flat regions may be produced in precisely located regions of the wafer for subsequent device and integrated circuit processing. For example. for this invention, the atomic flatness in regions under all the gates of the MOSFETs should be under excellent control to give uniform behavior to the many individual MOSFETs of an integrated circuit. The various means to produce these regions would include well known interferometric methods. It would also include physical obstructions with Si or other "screenwire shadow masks" interposed near the wafer in front of an intense large area beam. It should be noted that the concave regions produced by such multiple beams gives a group of concave regions on a wafer with atomically flat bottoms quite similar to the dimples, produced by a different process, described in U.S. patent application Ser. No. 09/187,730, filed Nov. 9, 1998, the entire disclosure and contents of which is hereby incorporated by reference.

Another method to minimize surface modulations is to cut the Si(11X) wafer off-axis in particular directions by ~0.1 to 5 degrees, thereby ensuring that the misalignment steps will be in the same general directions. In a MOSFET made on a (11X) wafer, the source-to-drain current may be arranged so that it flows parallel to the atomic ridges (i.e. [$\bar{1}$10] direction), perpendicular to the atomic ridges, or in an arbitrarily chosen direction. The purposeful miscut angle should be greater than the largest misorientation angles of the original local modulations in crystal orientation so that all or most of the misalignment steps run in the same general direction. As Si wafer local flatness produced by standard chemical-mechanical polishing or other procedures improves, and as the precision of the original orientation angle improves, the need for off-axis cuts of the Si wafer diminishes.

Figure 8:
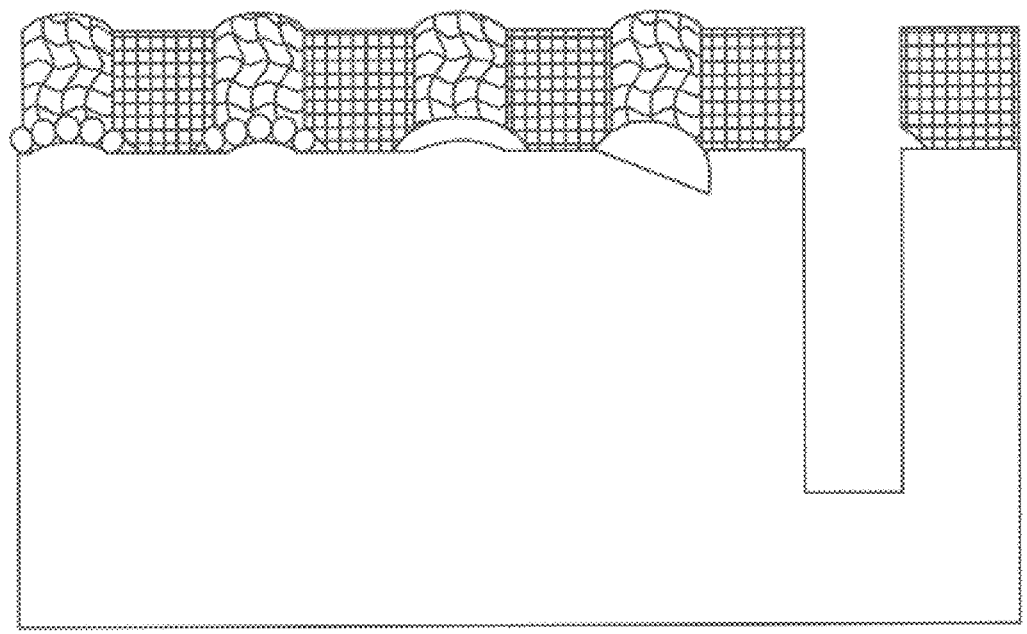
FIG. 8 illustrates from left to right, an end-on view of Ag nanowires covered with a thin Au layer, a small cavity after dissolving the Ag in nitric acid through the porous Au, after dissolving the Si with an anisotropic wet etchant, and after a liftoff process and a deep dry etching step where a typical pitch between ridges and grooves is 5.35 nm.

When Ag is the metal deposited as nanowires, the resulting Ag nanowires may be used as etch masks for etching Si, either with wet chemistry or dry etching. Preferably. the Ag nanowires are thickened by depositing more Ag or Au, or other materials to make the nanowires a more robust etch mask. The resulting nanowire width should not exceed the pitch of the nanowire array. FIG. 8 illustrates Ag nanowires covered with a thin Au layer which allows the Ag nanowires to be taken out of the UHV system into normal room air without oxidation of the thin Ag. The thin Au (or also Cu) layer of about 5 to 20 nm thickness is porous enough to allow wet chemical etchants like nitric acid to penetrate to the underlying Ag nanowires and dissolve the Ag (and not the Au) and form a small cavity. If ultrasonic agitation is added during this process, the Au directly above the Ag layer may often be lifted off to provide openings in the thicker Au layer that may be used to etch the Si in subsequent wet or dry etching processes. This results in very narrow nanogrooves that arc in the same position as the original Ag nanowires, thereby acting as a positive etch-resist process.

Figure 9:
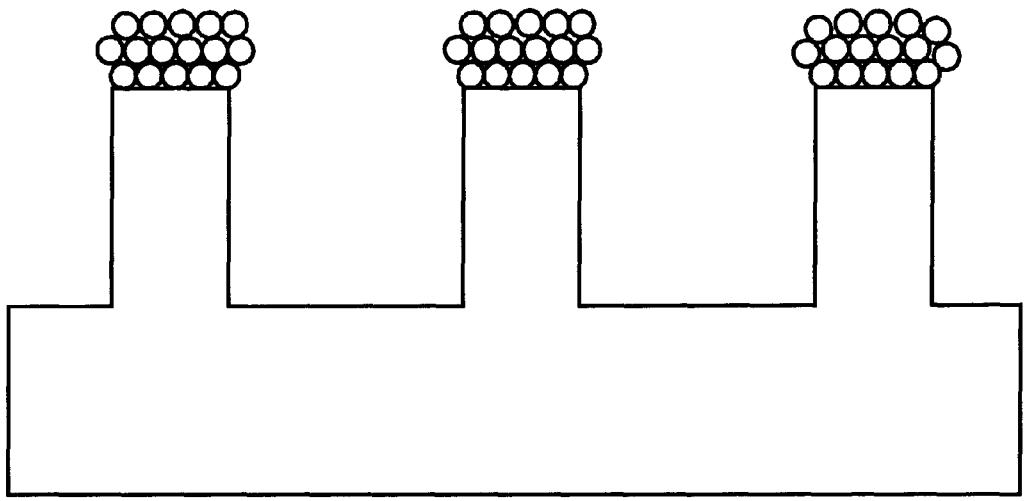
FIG. 9 illustrates the final result of a negative etch mask process using the method of the present invention.
Figure 10:
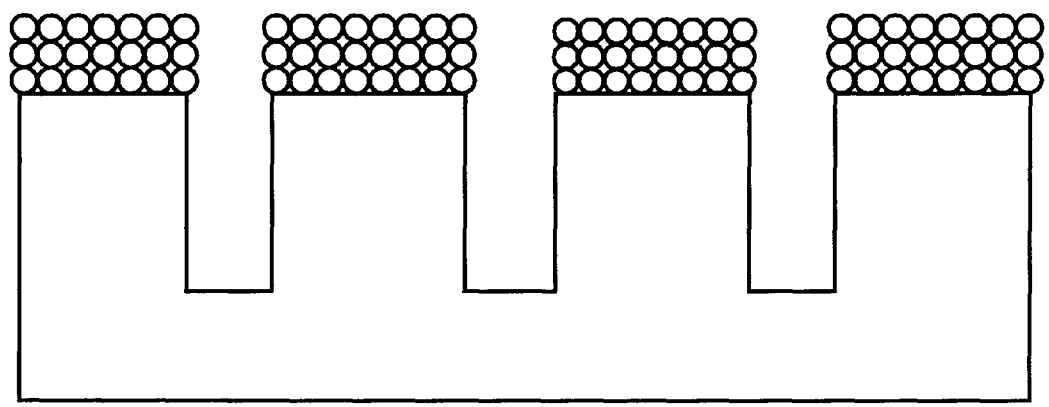
FIG. 10 illustrates the final result of a positive etch resist process using the method of the present invention.

By contrast, FIG. 9 illustrates how to produce a negative etch mask using the method of the present invention. In this case, Au (or more Ag) is evaporated onto the Si wafer containing the single ML nanowires of Ag at a temperature of 200 to 350° C. In this range of temperature, the additional Au or Ag will not stick to the clean Si between the Ag stripes, but it will adhere to the original Ag nanowires and they become thicker and much more robust. Then when the Si is either wet or dry etched, the nanogrooves are formed in regions where there is no metal etch mask, thereby acting as a negative etch-resist process. Finally, FIG. 10, which is discussed above, illustrates a method for producing a positive etch mask using the method of the present invention. Thus, either a "positive" or a "negative" atomic lithography may result from using the methods of the present invention. A Cu or gold-coating deposited on top of the Ag nanowires allows UHV samples to be taken out into normal room ambient temperature for subsequent processing.

It will be appreciated that we have not specifically discussed nanodots in this application, but almost all of the ridge producing processes discussed here have analogues in the world of quantum dots. This will be apparent from a careful reading of the atomic "cookie cutter" technique for producing regularly spaced dot arrays from metal ridges and wires, as discussed in U.S. patent application Ser. No. 09/187,730, filed Nov. 9, 1998, the entire disclosure and contents of which is hereby incorporated by reference.

Figure 4:
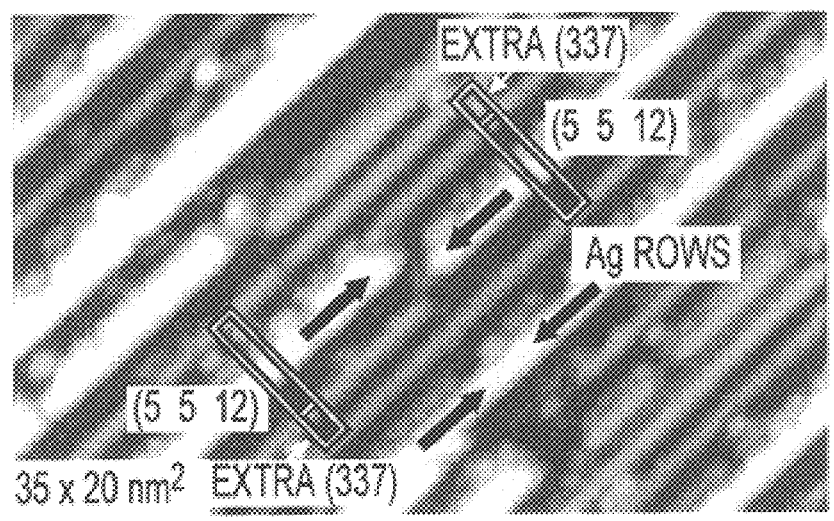
FIG. 4 illustrates the Ag nanowire growth phase on Si(5 5 12), but in this case a disruption in the underlying Si periodicity results in a discontinuity in the overlayer Ag row.

The present invention will now be described by way of examples:

EXAMPLE 1 (FIGS. 1, 2, and 4)

The reconstructed (5 5 12)–2×1 surface consists of well-ordered rows oriented along [$\bar{1}$10], see FIG. 1. These rows incorporate structural units which have been observed on other Si surfaces, including dimers, tetramers, and pi-bonded chains. The pi-chains were the brightest rows on the surface, where three such rows occur within each (5 5 12)–2×1 unit cell (0.77×5.35 $nm^2$). Another prominent defect structure found on this surface is the presence of disruptions in the (5 5 12) periodicity. The (5 5 12) unit cell may be divided into two subunits: (7 7 17) and (337), and the disruptions correspond to an extra or missing (337) unit cell, see FIG. 2. When Si(5 5 12) is used as a template in the growth of nanowires, the presence of disruptions in the periodic nature of this surface impacts the formation of such wires. FIG. 4 shows two Ag nanowires that appear to be misaligned. This misalignment is caused by the presence of an extra (337) unit cell. Therefore, these defect structures may affect the periodic structure of overlayer metal rows.

EXAMPLE 2 (FIG. 3)

Figure 3:
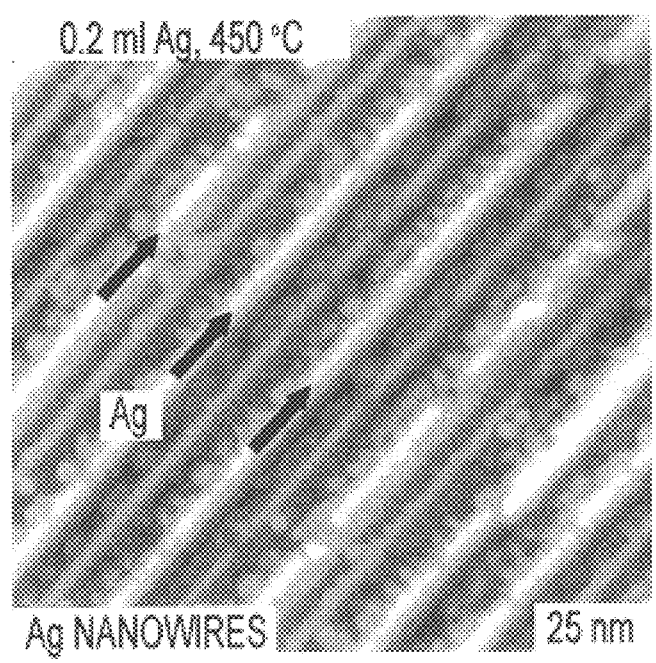
FIG. 3 illustrates a nanowire growth phase of Ag on Si(5 5 12) at low coverage (~0.20 ML) and moderate annealing temperature (450 to 550° C.), where the Ag rows are the bright, overlayer rows.

0.2 to 0.3 ML Ag was deposited onto a Si(5 5 12) wafer and annealed at 450 to 500 ° C. Straight Ag nanowires form with a pitch of 5.35 nm, as shown in FIG. 3. These nanowires are 1.5 to 2 nm wide and have an average length of ~65 nm. Preferential nucleation of Ag on the (5 5 12) surface leads to the ordered formation of a periodic array of nanowires.

EXAMPLE 3 (FIG. 5)

Figure 5:
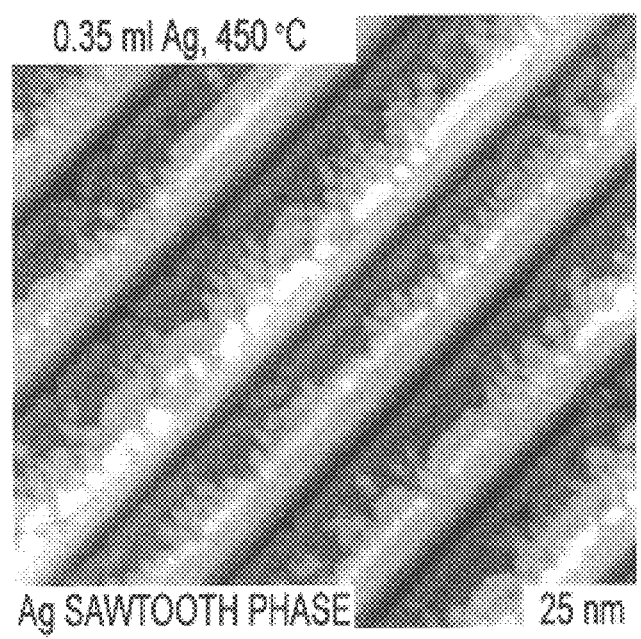
FIG. 5 illustrates a higher coverage, "sawtooth" phase of Ag growth on Si(5 5 12)

0.25 to 0.5 ML Ag was deposited onto a Si(5 5 12) wafer and annealed at 500 to 600 ° C. The morphology at this coverage regime resembles nanoscale sawtooths along the [$\bar{1}$10] direction, as shown in FIG. 5. The sawtooths are about 0.4 nm tall and have a pitch comparable to the (5 5 12) unit cell.

EXAMPLE 4 (FIG. 6)

Figure 6:
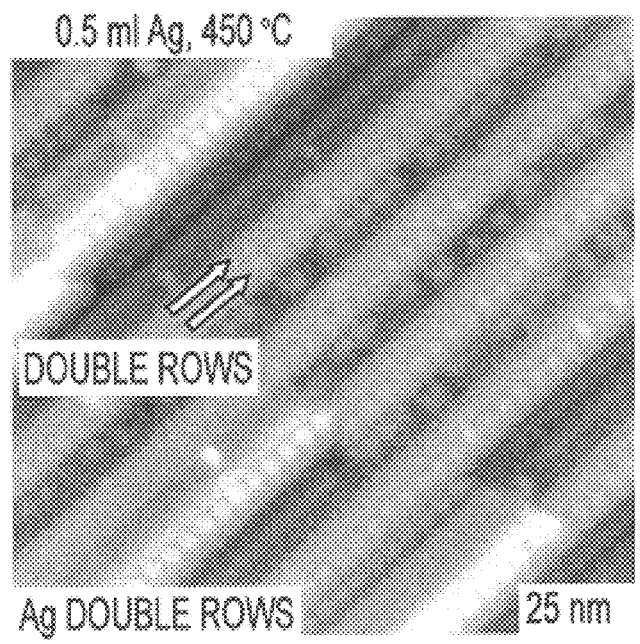
FIG. 6 illustrates a higher-coverage, "stepped double row" phase of Ag growth on Si(5 5 12)

0.5 ML Ag was deposited onto a Si(5 5 12) wafer and annealed at 500 to 600° C. A well-ordered array of "double rows" is formed, as shown in FIG. 6. These double rows are the most ordered structures induced by Ag at any coverage and annealing temperature explored in our studies.

EXAMPLE 5 (FIG. 7)

0.04 to 0.12 ML of Au may be deposited onto a Si(7 7 15) wafer and annealed at 800° C. Perfectly straight nanowires with a pitch of precisely 3.45 nm are formed over wide expanses of the Si wafer.

EXAMPLE 6

0.2 to about 1.0 ML of Au may be deposited on a Si(5 5 1 1) wafer and annealed at ~800° C. Perfectly straight nanowires with a pitch of 2.5 nm are formed.

EXAMPLE 7 (FIG. 9)

Wet or Dry Etch Nano Fabrication Method—One step process

After the steps of Examples 2, 3, or 4 are performed, the Ag nanowires are used as an etch mask for a brief dry etch process using one of the well known plasma etching processes such as RIBE. This etch process is often quite brief because the Ag layers are only about 1 ML thick and therefore erode reasonably fast in most dry etching processes. The Ag layers may be thickened by evaporating a few ML of additional Ag or Au at a substrate temperature in the range of 200 to 350° C. after the Ag nanowires have been formed, see FIG. 9. This temperature range is sufficiently low to avoid the eutectic melting temperature of Au:Si of ~370° C. and high enough to allow considerable surface diffusion and to not allow condensation on the Si surface except at the thin Ag lines. This thickening process allows thicker grooves to be etched into the Si in this one step etching process, but is still probably limited to a depth of less than about 20 nm before the somewhat thicker metal lines are excessively eroded by the wet or dry etching process.

EXAMPLE 8 (FIG. 9)

Dry Etch Nano Fabrication Method—Two-step negative-resist process

After the steps of Example 7 are completed, an oblique angle evaporation of Au, Ag, Cd, or other metal within about 5° of grazing incidence is performed at RT or lower temperature while rotating the wafer. According to a method discussed in the 1998 U.S. patent application Ser. No. 09/187,730, this will result in nearly vertically disposed metal ridges that will be much thicker than the original Ag or Au nanowire layers. The results of highly oblique evaporation are discussed by K. Robbie, et al, J. Vac. Sci. Tech. B, 16(3), 1115–1122 (1998). This evaporated thicker metal nanowire is more robust in wet chemical etching processes. and will survive the much longer dry etch treatment of the second etching step. For a narrow metal ridge with a thickness of 10 to 50 nm, corresponding depths of at least 10 to 50 nm, respectively, will be obtainable using almost any of the modern plasma etching methods. Much deeper grooves may be obtained using the directed beam chemically reactive plasmas typical of RIBE and related processes. Such deep vertical grooves are important to the Buckyball superconductor applications discussed in the 1998 Pending Patent, as well as to the atomic-width filters and sensors discussed in the companion patent submitted along with this one. The oblique incidence evaporation may be preceded by a few ML of an evaporated adhesion-promoting metal layer such as Ti or Cr to ensure that the metal ridges stay in place during the wet or dry etching processes. The adhesion layer may be deposited at either oblique or near normal incidence depending on the particular application and the desired robustness. It is clear from FIG. 9 that the groove is etched where there is no metal mask, which reverses the pattern of the metal pattern. This is therefore also a negative nano-lithography process. The positive etch-resist process was discussed earlier and is illustrated in FIG. 10. Although the present invention has been fully described in conjunction with the preferred embodiment thereof with reference to the accompanying drawings, it is to be understood that various changes and modifications may be apparent to those skilled in the art. Such changes and modifications are to be understood as included within the scope of the present invention as defined by the appended claims, unless they depart therefrom. For example, the same general methods are applicable to all semiconductors, and in fact to all crystalline materials that exhibit open channels along particular crystal directions. Also, it should be appreciated that most of the ranges above refer to Si and may be increased or decreased by up to 30% for other crystals unless otherwise indicated.

What is claimed is:

1. A method for producing atomic ridges on a substrate comprising:
    depositing a first metal on a substrate;
    heating said substrate to form initial nanowires of said first metal on said substrate;
    depositing a second metal on said initial nanowires of said first metal to form thickened nanowires that are more resistant to etching than said initial nanowires; and
    etching said substrate to form atomic ridges separated by grooves having a pitch of 0.94 to 5.35 nm.

2. The method of claim 1, wherein said substrate comprises Si.

3. The method of claim 2, wherein said substrate is heated to a temperature of about 1100 to 1200° C. and allowed to cool to RT prior to depositing said first metal on said substrate.

4. The method of claim 1, wherein said depositing of said first metal and said heating of said substrate is conducted in a UHV system.

5. The method of claim 1, wherein said first metal and said second metal comprise the same metal.

6. The method of claim 1, wherein said first metal and said second metal comprise different metals.

7. The method of claim 1, wherein said first metal comprises Ag.

8. The method of claim 7, wherein said second metal comprises Au.

9. The method of claim 1, wherein said first metal comprises Au.

10. The method of claim 1, wherein said substrate comprises a Si(5 5 12) wafer.

11. The method of claim 10, wherein said first metal comprises 0.2 to 0.5 ML of Ag, said substrate is heated to a temperature of about 450° C., and said grooves have a pitch of 5.35 nm.

12. The method of claim 1, wherein said substrate comprises a Si(7 7 15) wafer.

13. The method of claim 12, wherein said first metal comprises 0.04 to 0.12 ML of Au, said substrate is heated to a temperature of about 800° C., and said grooves have a pitch of 3.45 nm.

14. The method of claim 1, wherein said substrate comprises a Si(5 5 11) wafer.

15. The method of claim 14, wherein said first metal comprises 0.2 to 1.0 ML of Au, said substrate is heated to a temperature of about 800° C., and said grooves have a pitch of 2.5 nm.

16. The method of claim 1, further comprising treating said substrate with a surfactant-restructurant prior to depositing said first metal.

17. The method of claim 16, wherein said surfactant-restructurant comprises Ga.

18. The method of claim 1, wherein misalignment steps on said substrate are parallel to said atomic ridges.

19. The method of claim 1, wherein misalignment steps on said substrate are perpendicular to said atomic ridges.

20. The method of claim 1, wherein misalignment steps on said substrate are neither parallel nor perpendicular to said atomic ridges.

21. The method of claim 1, further comprising covering said thickened nanowires and said substrate with Cu prior to etching said substrate.

22. The method of claim 1, further comprising covering said thickened nanowires and said substrate with Au prior to etching said substrate.

23. A method for producing Au nanowires on a substrate comprising:

depositing Au on a substrate;

heating said substrate to form a plurality of Au nanowires on said substrate wherein at least two adjacent nanowires of said plurality of Au nanowires are at a pitch of 2.5 to 3.45 nm, wherein said substrate is treated with a surfactant-restructurant prior to depositing Au.

24. The method of claim 23, wherein said substrate comprises Si.

25. The method of claim 23, wherein said substrate is heated to a temperature of about 1100 to 1200° C. and allowed to cool to RT prior to depositing Au on said substrate.

26. The method of claim 23, wherein said depositing of Au and said heating of said substrate is conducted in a UHV system.

27. The method of claim 23, wherein said substrate comprises a Si(5 5 12) wafer.

28. The method of claim 23, wherein said substrate comprises a Si(7 7 15) wafer.

29. The method of claim 23, wherein said substrate comprises a Si(5 5 11) wafer.

30. The method of claim 23, wherein Au is deposited on said substrate at a thickness of 0.04 to 1.0 ML.

31. The method of claim 23, wherein said substrate is heated to a temperature of about 800° C.

32. The method of claim 23, wherein at least a portion of said plurality of nanowires has a pitch of 2.5 nm.

33. The method of claim 23, wherein said surfactant-restructurant comprises Ga.

34. The method of claim 23, wherein at least a portion of said plurality of nanowires has a pitch of 3.45 nm.

35. The method of claim 23, wherein misalignment steps on said substrate are parallel to said atomic ridges.

36. The method of claim 23, wherein misalignment steps on said substrate are perpendicular to said atomic ridges.

37. The method of claim 23, wherein misalignment steps on said substrate are neither parallel nor perpendicular to said atomic ridges.

* * * * *

UNITED STATES PATENT AND TRADEMARK OFFICE
CERTIFICATE OF CORRECTION

PATENT NO.    : 6,413,880 B1
DATED         : July 2, 2002
INVENTOR(S)   : Alison Baski and Don Kendell It is certified that error appears in the above-identified patent and that said Letters Patent is hereby corrected as shown below:

Column 3,
Line 34, "100-1200°C" should read -- 1100-1200°C --;
Line 61, "Baski et al., J. Vac. And Tech. 17, 1696 (1999)." should read -- Song et al., *J. Vac. Sci. Technol. A* 17, 1696 (1999), --;
Line 65, "1150-1200° C." should read -- 1150-1200°C --; and
Line 67, "5.35" should read -- 0.77 x 5.35 --.

Column 6,
Line 14, "arc" should read -- are --.

Column 7,
Lines 10-11, "[īl0]" should read -- [-110] --; and
Lines 31-32, "Si(5 5 1 1)" should read -- Si(5 5 11) --.

Signed and Sealed this

Fourteenth Day of January, 2003

JAMES E. ROGAN
*Director of the United States Patent and Trademark Office*